United States Patent [19]

Abe

[11] 4,099,265
[45] Jul. 4, 1978

[54] SENSE LINE BALANCE CIRCUIT FOR STATIC RANDOM ACCESS MEMORY

[75] Inventor: Kichio Abe, Yokohama, Japan
[73] Assignee: Motorola, Inc., Schaumburg, Ill.
[21] Appl. No.: 753,234
[22] Filed: Dec. 22, 1976
[51] Int. Cl.² .................... G11C 7/02; G11C 11/40
[52] U.S. Cl. ............................... 365/190; 307/279; 365/154; 365/202
[58] Field of Search ............... 340/173 FF; 365/154, 365/190, 202; 307/279, 238

[56] References Cited

U.S. PATENT DOCUMENTS

| | | | |
|---|---|---|---|
| 3,936,810 | 2/1976 | Dunn | 340/173 FF |
| 3,949,383 | 4/1976 | Askin et al. | 340/173 FF |
| 3,949,385 | 4/1976 | Sonoda | 340/173 FF |
| 4,006,469 | 2/1977 | Leehan et al. | 340/173 FF |

*Primary Examiner*—Stuart N. Hecker
*Attorney, Agent, or Firm*—Joe E. Barbee

[57] ABSTRACT

A random access memory includes a column of static MOS storage cells. Two sense-write write conductors are coupled to each cell in the column. The first sense-write conductor of each column of storage cells is coupled by means of a first coupling MOSFET to a first bit-sense conductor. The second sense-write conductor of each column of storage cells is coupled, by a second MOSFET to a second bit-sense conductor. Each sense-write conductor is coupled to the other by a first MOSFET having its gate electrode coupled to a circuit for generating a pulse in response to an address input transition. A second balancing MOSFET is coupled between the two bit sense conductors and has its gate also coupled to said circuit. Since at the end of any read or write operation, the two bit sense conductors and the two sense-write conductors of the selected column will be at opposite voltage levels, the output pulse equalizes the voltages of the two sense write conductors and of the two bit sense conductors at a level approximately midway between the voltages of a power supply conductor and ground, so that during the next read cycle the cell need only discharge one of the sense-write conductors and the corresponding bit sense conductor coupled thereto from the midway voltage level to ground, thereby considerably reducing the access time of the memory.

4 Claims, 3 Drawing Figures

SENSE LINE BALANCE CIRCUIT FOR STATIC RANDOM ACCESS MEMORY

BACKGROUND OF THE INVENTION

1. Field of the Invention

The invention relates to static MOS random access memories.

2. Brief Description of the Prior Art

Static MOS RAM's are commonly implemented utilizing six transistor storage cells. For example, see U.S. Pat. No. 3,594,736. The six-transistor storage cells are each comprised of cross-coupled back-to-back inverters. The outputs of each inverter are also connected, respectively, to two isolation MOSFETs. Each isolation MOSFET is coupled, respectively, to a separate sense-write conductor which has a substantial parasitic capacitance associated therewith. Each sense-write conductor is coupled to the source of a separate terminal MOSFET. Each termination MOSFET has its gate and source connected to a $V_{DD}$ conductor. Each of the storage cells is coupled between $V_{DD}$ and ground. In order to obtain low cost semiconductor RAMs, it is necessary that the storage cells be as small in size as possible. This requirement prevents the respective storage cells from being able to sink much sense current when they are selected during a read operation. At the beginning of a read operation, the two sense-write conductors coupled to the selected cell are normally at voltages equal to a MOSFET threshold voltage drop below $V_{DD}$, and one of the sense-write conductors remains at $V_{DD}$ and the other is discharged to approximately zero volts by the selected storage cell. Typically, a column of storage cells is selected by means of two column select MOSFETS which couple the respective sense-write conductors to a pair of bit-sense conductors which have a large capacitance associated therewith. The selected storage cell must therefore discharge the total capacitance of the one sense-write conductor and one bit-sense conductor from almost $V_{DD}$ volts to nearly zero volts. Consequently, the access times of MOS static random access memories are relatively slow.

SUMMARY OF THE INVENTION

It is an object of this invention to reduce the access time of a static MOS RAM.

It is another object of the invention to provide a circuit which equalizes the voltage between the sense-write conductors and bit-sense conductors of a MOS RAM at voltages approximately midway between the supply voltage and the ground voltage prior to a sensing operation to reduce the voltage drop through which the selected storage cell must discharge the sense-write conductor and the bit-sense conductor.

Briefly, described, the invention comprises a balancing MOSFET having its current carrying electrodes coupled to a pair of sense-write conductors associated with a column of static storage cells. The gate electrode of the balancing MOSFET is coupled to a circuit which senses the beginning of a read operation or one which sense the end of a write operation and generates a pulse of short duration which turns on the balancing MOSFET long enough to equalize the voltages of the two sense-write conductors and then turns the balancing MOSFET off.

DESCRIPTION OF THE INVENTION

Figure 1:
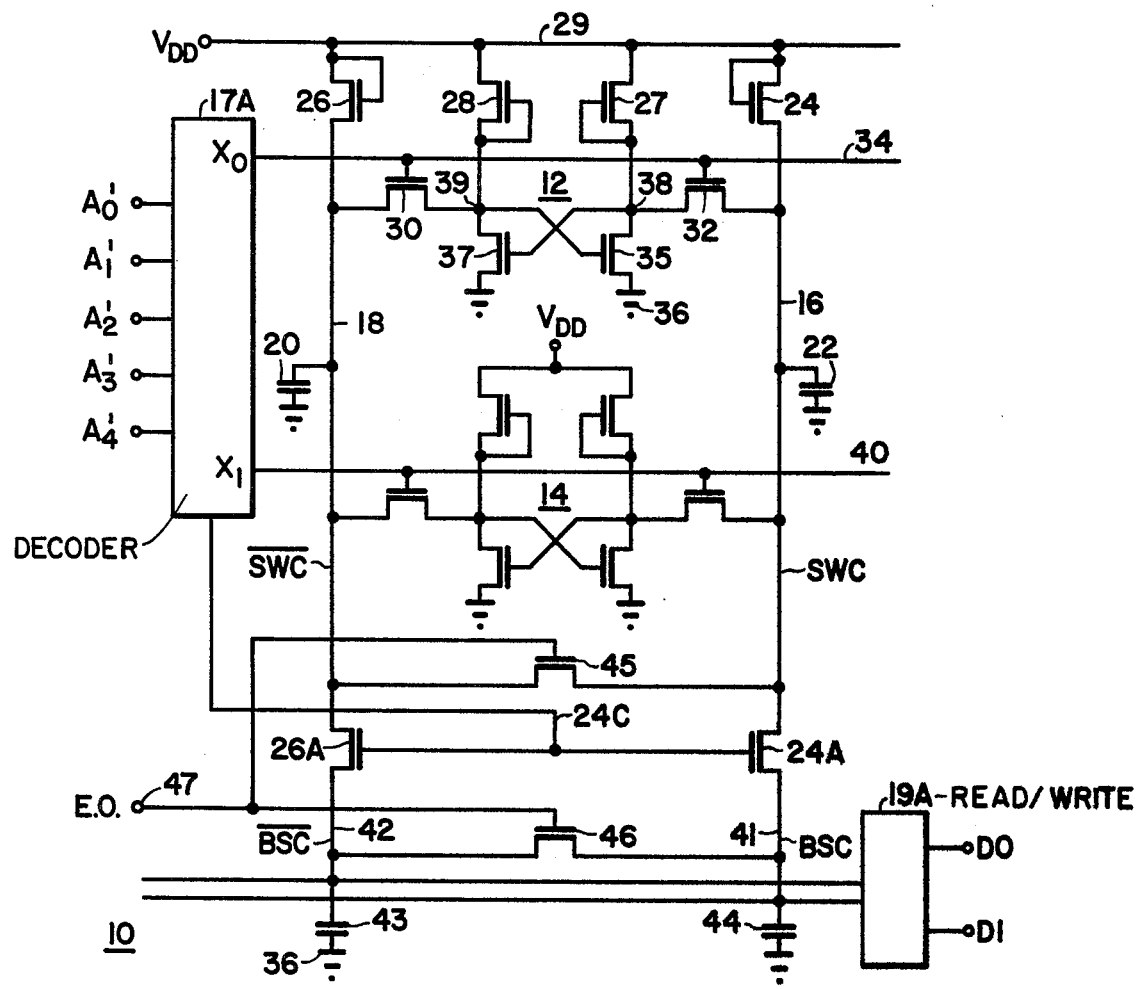
FIG. 1 is schematic diagram of a preferred embodiment of the invention.

Referring to FIG. 1, a portion 10 of an MOS memory includes static storage cells 12 and 14 arranged in a column. An entire memory would include a number of rows and columns of storage cells identical to storage cell 12. Storage cell 12 includes cross-coupled switching MOSFETS 35 and 37 coupled between ground conductor 36 and nodes 38 and 39 respectively. Load MOSFETS 27 and 28 are coupled between $V_{DD}$ conductor 29 and nodes 38 and 39, respectively. Isolation MOSFET 30 is connected between node 39 and sense-write conductor 18. Sense-write conductor 18 has a relatively large (compared to the node capacitances of the storage cells) parasitic capacitance 20 associated therewith. Isolation MOSFET 32 is connected between node 38 and sense-write conductor 16. Sense-write conductor 16 has parasitic capacitance 22 associated therewith. The gate electrodes of MOSFETs 30 and 32 are connected to row selection conductor 34, which is connected to a decode circuit 17A. Column selection MOSFET 26A is connected between sense-write conductor 18 and bit-sense conductor 42, which has a parasitic capacitance 43 associated therewith. Column selection MOSFET 24A is connected between sense-write conductor 16 and bit-sense conductor 41, which has a relatively large parasitic capacitance 44 associated therewith. The gate electrodes of MOSFETS 24A and 26A are connected to decode or selection circuit 17A.

Figure 3:
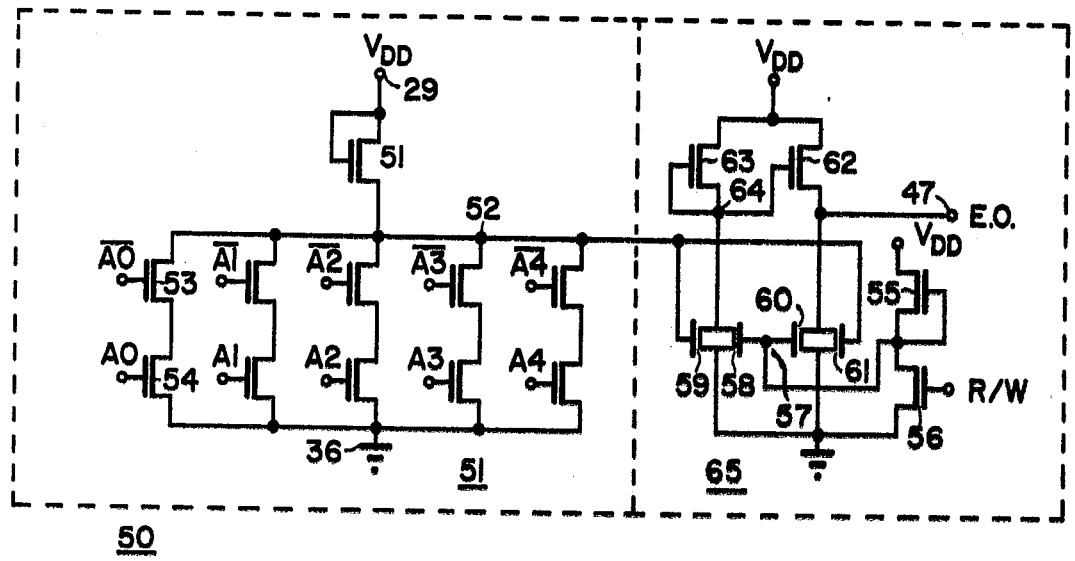
FIG. 3 is a schematic diagram of a exemplary circuit to provide the E.O. pulse to the circuit of FIG. 1.

According to the invention, a first balancing MOSFET 45 is connected between sense-write conductors 18 and 16, and has its gate connected to conductor 47, which is connected to a circuit which generates a pulse (E.O. in FIG. 3) prior to, or at the beginning of, a sensing operation in order to equalize the potential on sense-write conductors 16 and 18 by temporarily turning MOSFET 45 on during the pulse. FIG. 3 illustrates a circuit suitable for generating the pulse on conductor 47.

According to the invention, a second balancing MOSFET 46 is connected between bit-sense conductors 41 and 42, and has its gate connected to conductor 47. The above-mentioned pulse on conductor 47 also causes balancing MOSFET 46 to be turned on temporarily in order to equalize the potentials on bit-sense conductors 41 and 42 prior to a sensing operation.

Figure 2:
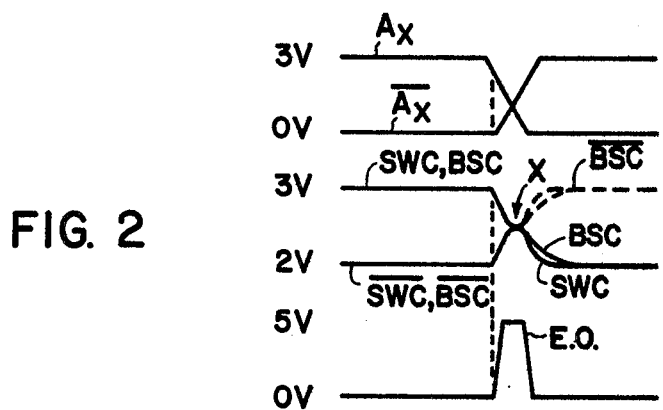
FIG. 2 is a timing diagram illustrating the operation of the embodiment of FIG. 1.

FIG. 3 discloses a circuit capable of producing the desired E.O. pulse on conductor 47. Circuit 50 consists of an AND/NOR circuit having a plurality of pairs of series-connected MOSFETs such as 53 and 54. The inputs to the MOSFETs such as 53 and 54 for each of the pairs of such MOSFETs are the respective addresses and address complements for each of the address inputs. Output node 52 will normally be held at a MOSFET threshold voltage drop below $V_{DD}$, except when there is a transition of one or more of the address inputs to the memory. For example, if the A0 address input changes, the $\overline{A0}$ and the A0 waveforms will have an appreciable amount of slope, and there will be a period of time during which both $\overline{A0}$ and A0 are greater than the threshold voltages of MOSFETs 53 and 54, respectively, and therefore both MOSFETs 53 and 54 will be on at the same time, pulling node 52 toward ground. By the end of the transition, AO and $\overline{AO}$ will be at opposite logic levels, and one of the two MOSFETs 53 and 54 will be off. The other pairs of series-connected MOSFETs operate in the same manner, so node 52 will always be only momentarily pulled to ground during transitions of the address inputs. The driver circuit 65 consists of a NOR gate including MOSFETs 58, 59 and 63 followed by a driver circuit consisting of MOSFET 60, 61 and 62. Ordinarily, since node 52 will be at logical "1", MOSFETs 59 and 61 will be on and E.O. will be at ground. But whenever node 52 goes to ground, MOSFETs 59 and 61 will be in an off condition, and if the R/W (read/write) input is at ground, node 57 will be at $V_{DD}$, and MOSFETs 58 and 60 will be on, so E.O. will remain at ground. But if R/W is at a logic "1", node 57 will be near ground, and MOSFETs 58 and 60 will be off, so that the positive pulse E.O. will appear at terminal 47, as shown in the bottom waveform of FIG. 2. The operation of the circuit of FIG. 1 is explained with reference to FIG. 2. As explained earlier, the E.O. signal is generated by the circuit of FIG. 3 during the transitions of the address input $A_x$ and $\overline{A_x}$, where x can be 0, 1, 2, 3, etc.

For the following discussion, assume that one of the storage cells in the column shown in FIG. 1 has been subjected to a write operation in which conductors 41 and 16 were driven to $V_{DD}$ volts by a write or read-write circuit 19A, and conductors 18 and 42 were driven to a zero voltage level, and that storage cell 12 is about to be subjected to a read operation. Also assume that storage cell 12 contains a logical state such that MOSFET 35 is in an on condition, so that MOSFET 37 is in an off condition. As the address inputs change so that conductor 34 will be selected by the decode circuitry the circuit of FIG. 3 generates the EO pulse shown in FIG. 2. This causes the MOSFETs 45 and 46 to be turned on so that all of the charge associated with parasitic capacitances 20 and 22 is redistributed and conductors 16 and 18 both are established at approximately $V_{DD}/2$ volts. Similarly, a charge on parasitic capacitances 43 and 44 is redistributed so that both conductors 41 and 42 are also established at approximately $V_{DD}/2$ volts. MOSFETs 30 and 32 are turned on by the row selection conductor 34. The series combination of MOSFETs 32 and 35 discharges conductors 16 and 41 relatively slowly to approximately zero volts, while the series combination of MOSFETs 30 and 28 start to gradually pull conductors 18 and 42 to $V_{DD}$, by the parallel action of termination MOSFET 26.

It must be recognized that if balancing MOSFETs 45 and 46 were not provided, then the series combination of MOSFETs 32 and 35 would have to discharge conductors 16 and 41 and their associated parasitic capacitances all the way from $V_{DD}$ volts down to zero volts in order to sense the stored state. Due to the fact that the storage cells are necessarily very small (in order to keep cost of the memory low) and have very small current sinking capabilities, it is seen that a substantial portion of the access time has been saved by causing a rapid equalization of the voltages on conductors 16 and 18 prior to and also conductors 41 and 42 or at the beginning of the sensing operation by providing balancing MOSFETs 45 and 46. In the absence of providing balancing MOSFETs 45 and 46 and the circuitry for quickly pulsing them to balance the sense-write conductors and the bit-sense conductors, it would be further necessary to allow a sufficient amount of time delay after the completion of the write cycle to permit conductors 18 and 42 to be reestablished at a voltage reasonably close to $V_{DD}$ volts, either by virtue of the charging effect of termination MOSFET 26 or by some other circuit. Therefore, it can be seen that provision of the balancing MOSFETs 45 and 46 reduces the access time of the memory not only by providing an initial rapid partial discharge of the sensing conductors, but also eliminates the need for allowing a period of time for the sensing conductors to recover from the sensing operation by being charged up by the termination MOSFETs 24 or 26.

What is claimed is:

1. A memory including: a plurality of storage cells, first means for selecting one of said storage cells in response to a change in an address input of said memory; first and second sense-write conductors coupled to each of said storage cells for writing information into and sensing information out of a selected one of said storage cells; a second means responsive to said change in said address input coupled to said first and second sense-write conductors for equalizing the voltages on said first and second sense-write conductors prior to completion of a read operation of said memory; first conductor means and second conductor means, a first selection field effect transistor coupled between said first sense-write conductor and said first conductor means and a second selection field effect transistor coupled between said second sense-write conductor and said second conductor means, said first and second selection field effect transistors having their control electrodes coupled to a selection conductor, and further including second balancing MOSFET coupled between said first and second conductors and having its gate electrode coupled to said second means fo equalizing the voltages on said first and second conductor means.

2. The memory as recited in claim 1 wherein said second means includes a field effect transistor coupled between said first and second sense-write conductors, and further including third means coupled to said address input and to the electrode of said field effect transistor for generating a pulse in response to said change in said address input, said pulse turning said field effect transistor on long enough to equalize the potential on said first and second sense-write conductors.

3. The memory as recited in claim 2 wherein each of said storage cells is a static storage cell comprised of cross coupled field effect transistor inverters having outputs coupled, respectively, to said first and second sense-write conductors by first and second field effect transistor isolation transistors each having their control electrode coupled to said first means.

4. A memory comprising: a plurality of storage cells; first means for selecting one of said storage cells in response to a change in an address input of said memory; first and second sense-write conductors coupled to each of said storage cells for writing information into and sensing information out of a selected one of said storage cells; a second means responsive to said change in said address input coupled to said first and second sense-write conductors for equalizing the voltages on said first and second sense-write conductors prior to completion of a read operation of said memory; a plurality of field effect transistors forming logic gates and having inputs to receive said address input; and a logic NOR gate coupled to said plurality of field effect transistors and having a first input to receive an output from said plurality of field effect transistors, said logic NOR gate further having a second input and an output, the second input of said logic NOR gate receiving a read/write signal to inhibit the output of said logic NOR gate when said memory is performing a read or write function, the output of said logic NOR gate being coupled to said second means to control the response of said second means.

* * * * *